(12) United States Patent
Behfar et al.

(10) Patent No.: US 7,957,445 B2
(45) Date of Patent: Jun. 7, 2011

(54) SPATIAL FILTERS

(75) Inventors: Alex A. Behfar, Ithaca, NY (US);
Alfred T. Schremer, Freeville, NY (US)

(73) Assignee: Binoptics Corporation, Ithaca, NY (US)

( * ) Notice: Subject to any disclaimer, the term of this patent is extended or adjusted under 35 U.S.C. 154(b) by 179 days.

(21) Appl. No.: 11/444,414

(22) Filed: Jun. 1, 2006

(65) Prior Publication Data
US 2006/0274804 A1 Dec. 7, 2006

Related U.S. Application Data

(60) Provisional application No. 60/685,883, filed on Jun. 1, 2005.

(51) Int. Cl.
*H01S 5/00* (2006.01)

(52) U.S. Cl. ............... 372/49.01; 372/43.01; 372/44.01; 372/33

(58) Field of Classification Search ............... 372/49.01, 372/43.01, 44.01, 33
See application file for complete search history.

(56) References Cited

U.S. PATENT DOCUMENTS

| | | | | |
|---|---|---|---|---|
| 4,100,508 A | * | 7/1978 | Wittke | 372/49.01 |
| 4,851,368 A | | 7/1989 | Behfar-Rad | |
| 5,282,080 A | * | 1/1994 | Scifres et al. | 359/344 |
| 5,357,536 A | * | 10/1994 | Andrews | 372/50.12 |
| 6,185,241 B1 | * | 2/2001 | Sun | 372/96 |
| 6,839,365 B1 | | 1/2005 | Sonoda | |
| 6,885,686 B2 | * | 4/2005 | Botez | 372/43.01 |
| 2005/0040410 A1 | * | 2/2005 | Ledentsov et al. | 257/79 |
| 2005/0083982 A1 | * | 4/2005 | Behfar | 372/50 |

OTHER PUBLICATIONS

A. Behfar-Rad, et al, "Monolithic AlGaAs-GaAs Single Quantum-Well Ridge Lasers Fabricated with Dry-Etched Facets and Ridges," IEEE Journal of Quantum Electronics, IEEE, vol. 28, ( No. 5), p. 1227-1231, (May 1992).
Stegmuller, et al, "Surface Emitting InGaAsP/InP Distributed Feedback Laser Diode at 1.53um With Monolithic Integrated Microlens," IEEE Photonics Technology Letters, IEEE, vol. 3 ( No. 9), p. 776-778, (Sep. 1991).
Behfar, et al, "Horizontal Cavity Surface-Emitting Laser (HCSEL) Devices," Proceedings of SPIE, SPIE (Bellingham, WA), vol. 5737, p. 62-68, (2005).
Vettiger, et al, "Full-Wafer Technology—A New Approach to Large-Scale Laser Fabricatin and Integration," IEEE Journal of Quantum Electronics, IEEE, vol. 27 ( No. 6), p. 1319-1331, (Jun. 1991).
Ghafouri-Shiraz, H., "Distributed Feedback Laser Diodes and Optical Tunable Filters," pp. 44-45 (2003).
Ghione, Giovanni, "Semiconductor Devices for High-Speed Optoelectronics," pp. 291-293 (2009).

* cited by examiner

*Primary Examiner* — Kinam Park
(74) *Attorney, Agent, or Firm* — Jones, Tullar & Cooper, P.C.

(57) ABSTRACT

An etched-facet single lateral mode semiconductor photonic device is fabricated by depositing an anti reflective coating on the etched facet, and depositing a reflectivity modifying coating in a spatially controlled manner to modify the spatial performance of the emitted beam.

19 Claims, 6 Drawing Sheets

US 7,957,445 B2

SPATIAL FILTERS

This application claims the benefit of Provisional Application No. 60/685,883, filed Jun. 1, 2005, the disclosure of which is hereby incorporated herein by reference. The present invention relates, in general, to photonic devices, and more particularly to improved laser devices and methods for fabricating them.

BACKGROUND OF THE INVENTION

One of the remaining problems in obtaining low-cost single lateral mode semiconductor lasers is controlling the lateral beam propagating in the laser cavity so that only a single lateral mode is allowed to operate over a wide range of currents and temperatures. One type of laser that has successfully solved this problem is the buried heterostructure laser; however, this success is at the expense of the need to regrow the semiconductor material after an initial patterning. Ridge lasers have eliminated the need for this regrowth; however, there are limitations placed on the width of the ridge as well as the depth to which the ridge can be etched while still allowing a single lateral mode behavior.

Semiconductor, or solid state, lasers are typically fabricated by growing the appropriate layered semiconductor material on a substrate through Metalorganic Chemical Vapor Deposition (MOCVD) or Molecular Beam Epitaxy (MBE) to form an active layer parallel to the substrate surface. The material is then processed with a variety of semiconductor processing tools to produce a laser cavity incorporating the active layer and incorporating metallic contacts attached to the semiconductor material. Laser mirror facets are typically formed at the ends of the laser cavity by cleaving the semiconductor material to define edges or ends of a laser optical cavity so that when a bias voltage is applied across the contacts, the resulting current flow through the active layer causes photons to be emitted out of the faceted edges of the active layer in a direction perpendicular to the current flow. Since the wafer is cleaved into bars to form the laser facets, conventional lithographical techniques on the wafer cannot be used to further process the lasers.

The problems encountered in semiconductor processing due to the need to cleave laser facets are overcome in U.S. Pat. No. 4,851,368, which discloses a process for forming the mirror facets of semiconductor lasers through etching, allowing lasers to be monolithically integrated with other photonic devices on the same substrate. This work was further extended and a process for fabricating a ridge laser process based on etched facets was disclosed in "Monolithic AlGaAs—GaAs Single Quantum-Well Ridge Lasers Fabricated with Dry-Etched Facets and Ridges", IEEE Journal of Quantum Electronics, volume 28, No. 5, pages 1227-1231, May 1992. These processes were further improved upon in U.S. patent application Ser. No. 11/356,203 of Alex A. Behfar, filed Feb. 17, 2006, and entitled "High Reliability Etched-Facet Photonic Devices" in which high reliability etched-facet photonic devices are described.

However, there is a need for a process for fabricating a photonic device such as a laser without the need for regrowth of the semiconductor material, while providing spatial lateral control of the laser output apart from the etch depth and width of the ridge, and such a laser is extremely desirable.

SUMMARY OF THE INVENTION

In accordance with the present invention, an improved process and method for making an etched-facet semiconductor photonic device is provided in which one of the device facets is first anti-reflection (AR) coated and then a reflectivity modification coating is applied in a spatially controlled manner so as to allow a single lateral mode laser to be fabricated. The reflectivity modification coating, in a preferred aspect of the invention, is a multilayer coating that serves as a spatial filter to allow a specific region of the facet to control the spatial behavior of the lateral mode of the laser. The position, size and shape of the spatial filter determines the beam shape of the laser.

BRIEF DESCRIPTION OF DRAWINGS

The foregoing, and additional objects, features and advantages of the present invention will be apparent to those of skill in the art from the following detailed description of preferred embodiments thereof, taken with the accompanying drawings, in which.

DETAILED DESCRIPTION OF PREFERRED EMBODIMENTS

Figure 1:
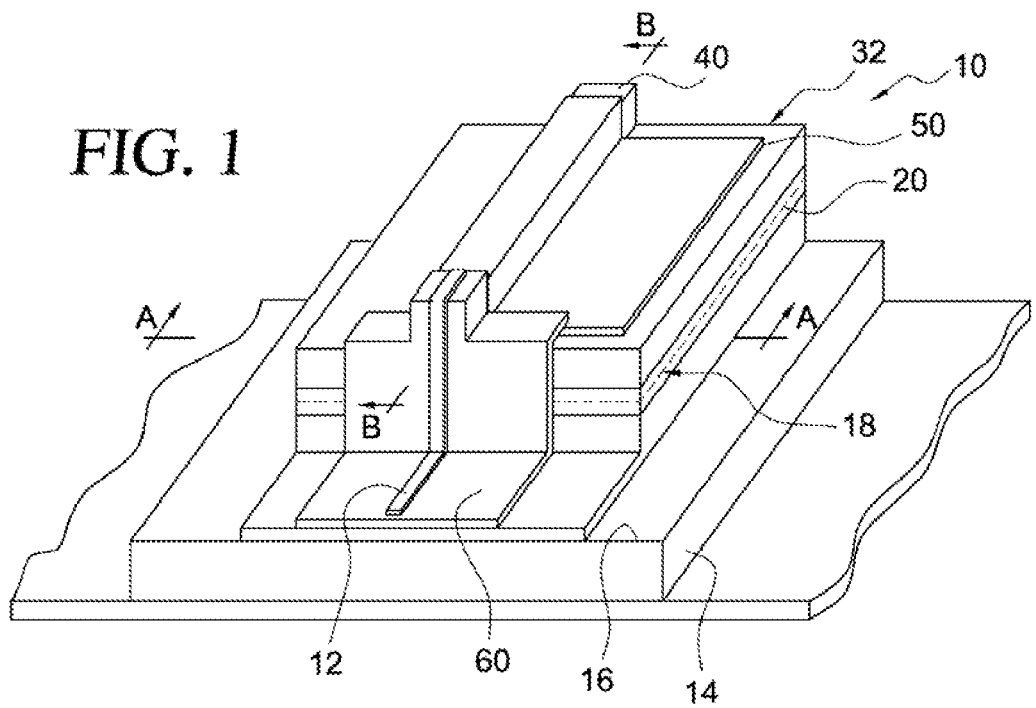
FIG. 1 is a diagrammatic perspective view of a semiconductor etched facet laser incorporating an antireflective coating to provide a spatial filter for controlling the lateral mode of the laser in accordance with a preferred mode of the present invention.

The problem of controlling spatial beam behavior in a semiconductor laser is overcome by the present invention, wherein a ridge-type laser 10 with a spatial filter 12 in accordance with the present invention is illustrated in FIG. 1. This laser is fabricated on a substrate, or chip 14, using the fabrication process illustrated diagrammatically in FIGS. 2(a and b) through FIGS. 8(a and b), to which reference is now made. Although the invention will be described in terms of a ridge laser such as that illustrated in FIG. 1, it will be understood that other types of lasers may be fabricated to incorporate the spatial filter described herein.

As is conventional, the substrate 14 may be formed, for example, of a type III-V type compound, or an alloy thereof, which may be suitably doped. On a top surface 16 of this substrate is deposited, as by known epitaxial deposition processes such as Metalorganic Chemical Vapor Deposition (MOCVD) or Molecular Beam Epitaxy (MBE), a succession of layers which form a photonic device such as an optical waveguide 18, that includes an active region 20, as illustrated in FIG. 1 and in FIGS. 2(a) and 2(b). The left-hand FIGS. 2(a)-8(a) are cross-sectional views of the waveguide taken along line A-A of FIG. 1, while the right-hand FIGS. 2(b)-8(b) are cross-sectional views of the waveguide taken along line B-B viewed in the direction of arrows B-B in FIG. 1.

In one embodiment of the invention, for example, the semiconductor photonic device 18 may be a laser epitaxially formed on an InP substrate 14. The photonic device structure would typically contain upper and lower cladding regions 22 and 24 formed from a semiconductor material such as InP which has a lower index than the active region 20. These cladding regions are adjacent the active region, which may be formed with AlInGaAs-based quantum wells and barriers, designed to emit light at a wavelength of 1310 nm when the laser is energized. An InGaAs cap layer (not shown) is provided to allow ohmic-contacts. Although the example given here is based on a single element laser device on an InP substrate, it is understood that other photonic devices with active regions can be fabricated, and that these devices can be formed on other substrates, such as GaAs and GaN.

Figure 2A:
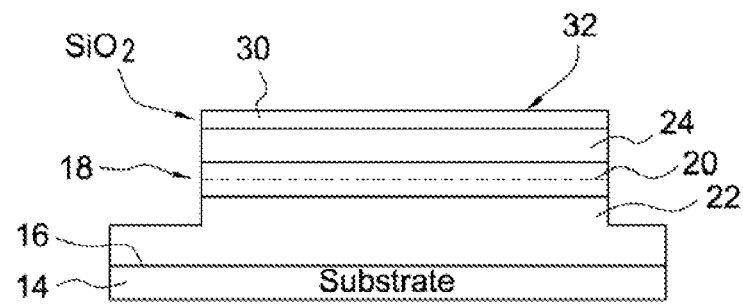
FIGS. 2(a and b) through 8(a and b) diagrammatically illustrate the fabrication steps for making the etched facet laser of FIG. 1, FIGS. 2(a) through 8(a) being cross-sections viewed in the direction of arrows A-A of FIG. 1, and FIGS. 2(b) through 8(b) being cross-sections viewed in the direction of arrows B-B of FIG. 1.
Figure 2B:
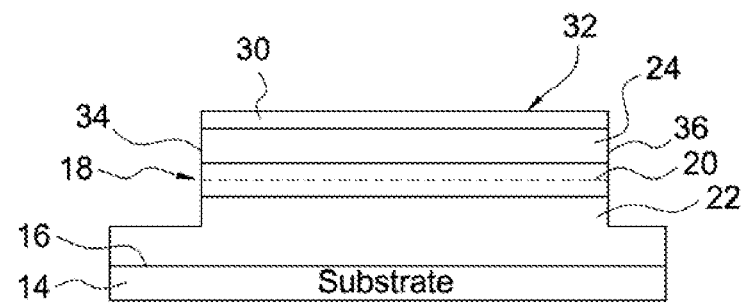

A 200 nm thick layer 30 of $SiO_2$ is deposited on the epitaxially grown laser structure 18 by plasma-enhanced chemical vapor deposition (PECVD), as illustrated in FIGS. 2(a and b). A first lithographic step (not shown), defining, for example, a laser body and facets in a photoresist layer, is performed and the photoresist pattern is transferred to the underlying $SiO_2$ layer 30, using reactive ion etching (RIE) to form an $SiO_2$ pattern, in known manner. After the photoresist is removed by oxygen plasma, the $SiO_2$ pattern is transferred to the photonic device structure 18, using chemically assisted ion beam etching (CAIBE) to form the laser body 32 and facets 34 and 36 illustrated in FIGS. 2(a) and 2(b).

Figure 3A:
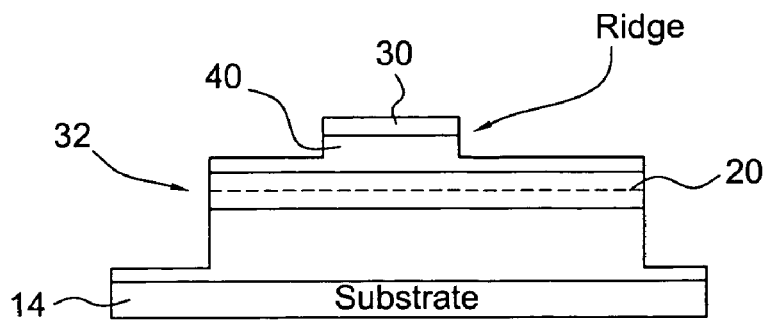
Figure 3B:
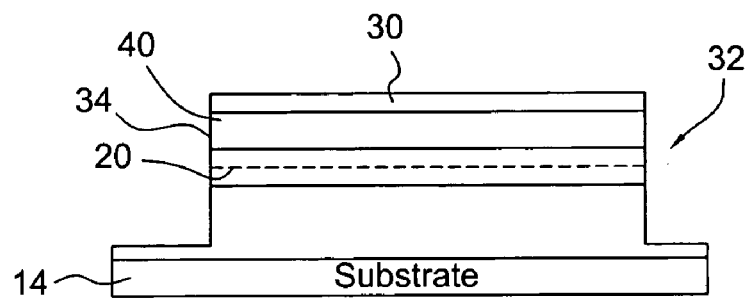
Figure 4A:
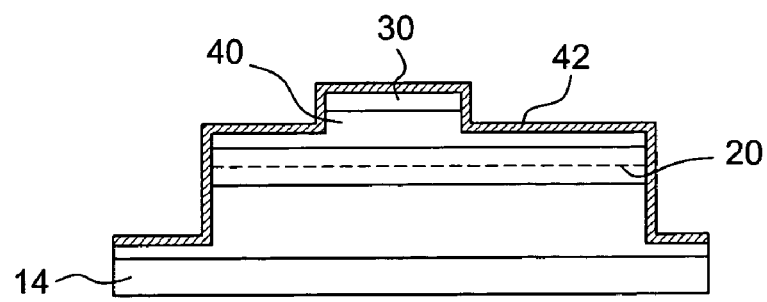
Figure 4B:
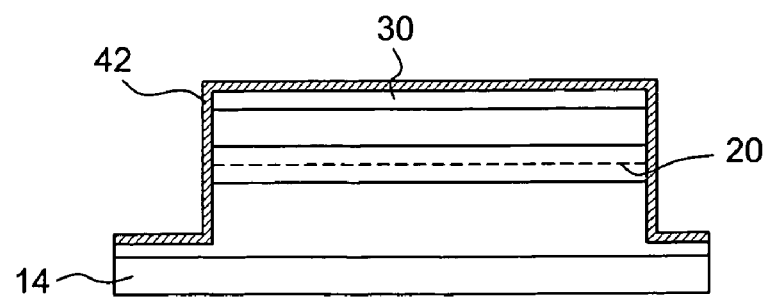

As illustrated in FIGS. 3(a) and 3(b), a second photoresist lithography is performed to produce a pattern defining one or more ridges on the substrate and RIE is used to transfer the photoresist pattern to the PECVD $SiO_2$ layer. After removing the photoresist with oxygen plasma, CAIBE is used to form the ridges, such as ridge 40, in the laser structure. The width of the ridge was 3.2 μm in one example.

After formation of the ridge illustrated in FIGS. 3(a) and 3(b), a 120 nm thick passivation layer 42 of $SiO_2$ is deposited, using PECVD, to cover the entire substrate, including the photonic device. This is illustrated for the single ridge 40 in FIGS. 4(a) and 4(b).

Figure 5A:
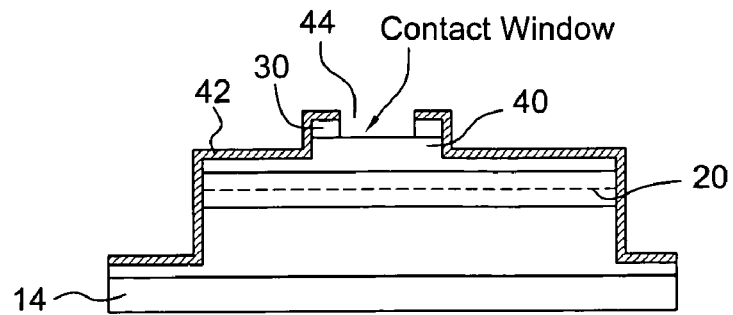
Figure 5B:
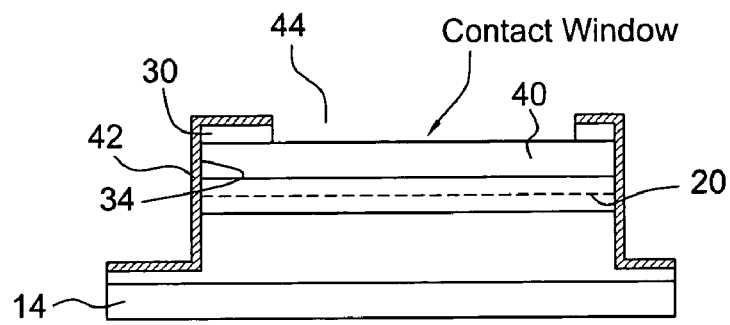

A third lithography for defining a p-contact opening on the photonic structure is performed and RIE is used to open a contact hole 44 in the $SiO_2$ layer. Oxygen plasma is then used to remove the photoresist, as shown in FIGS. 5(a) and 5(b).

Figure 6A:
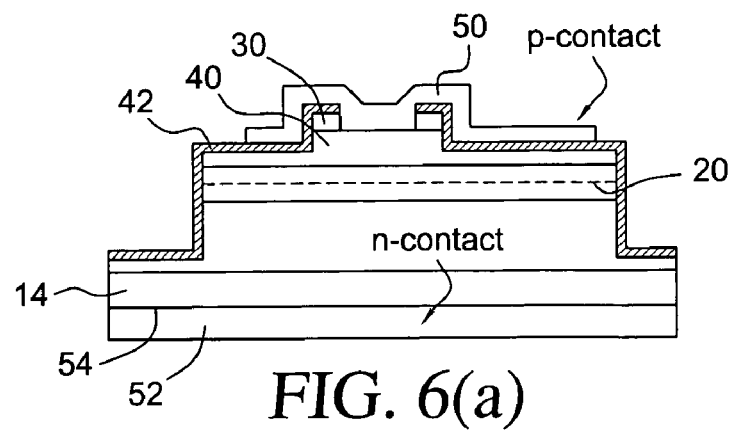
Figure 6B:
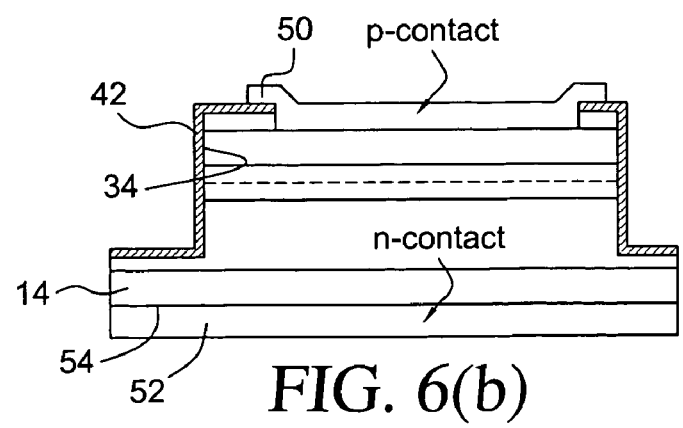

Lithography for p-contact metallization is then performed and p-contact metal 50 is evaporated using an e-beam evaporator. The p-contact for the device is defined after the lift-off of unwanted metallization, as is shown in FIGS. 6(a) and 6(b).

An n-contact 52 for the laser is also evaporated, using e-beam evaporation, on the backside 54 of the substrate. It will be understood that corresponding contacts may be provided for each of the photonic devices fabricated on the substrate. It will also be understood that the n-contact may be deposited on the top surface of the substrate using similar steps as are used to define the p-contact.

Figure 7A:
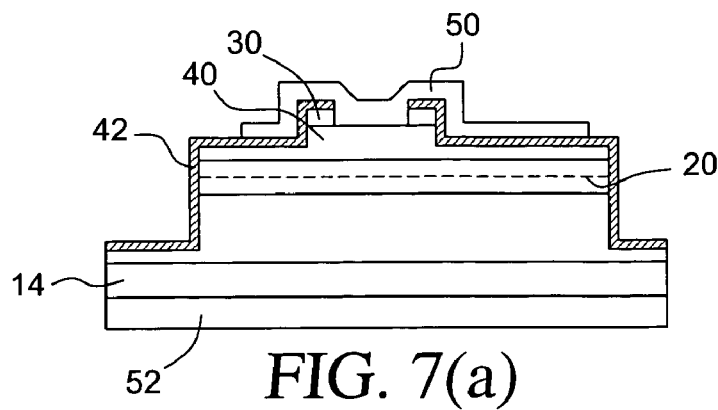
Figure 7B:
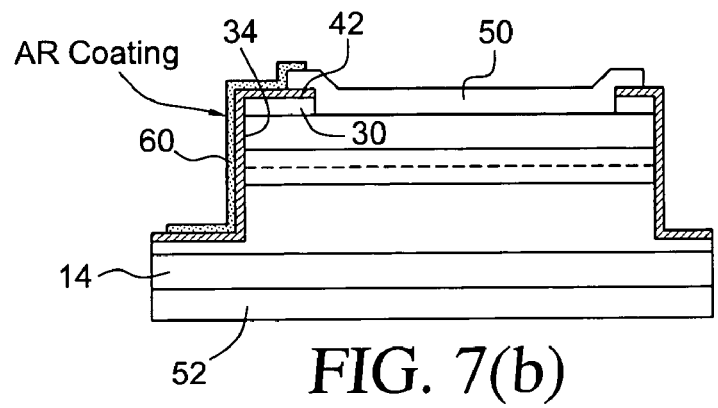

As illustrated in FIGS. 7(a) and 7(b), a 120 nm thick layer 60 of $Al_2O_3$ is deposited on one of the facets, for example, facet 34, through the photolithography of a lift-off pattern, evaporation of $Al_2O_3$, and lift-off. This layer 60 is essentially an anti-reflecting (AR) layer of less than 4% the laser facet 34. The laser emits laser light at a nominal wavelength of 1310 nm.

Figure 8A:
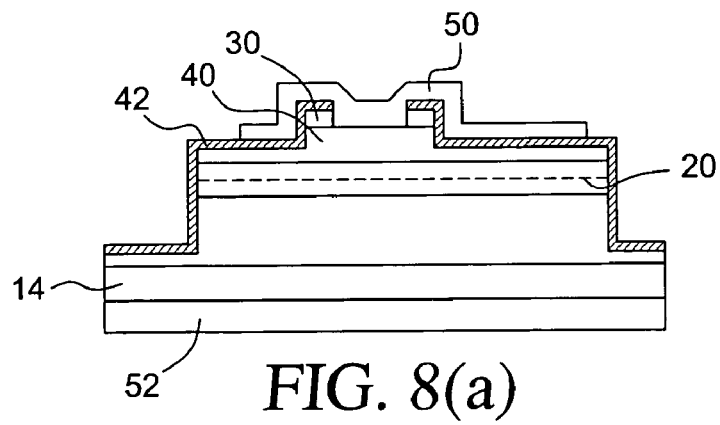
Figure 8B:
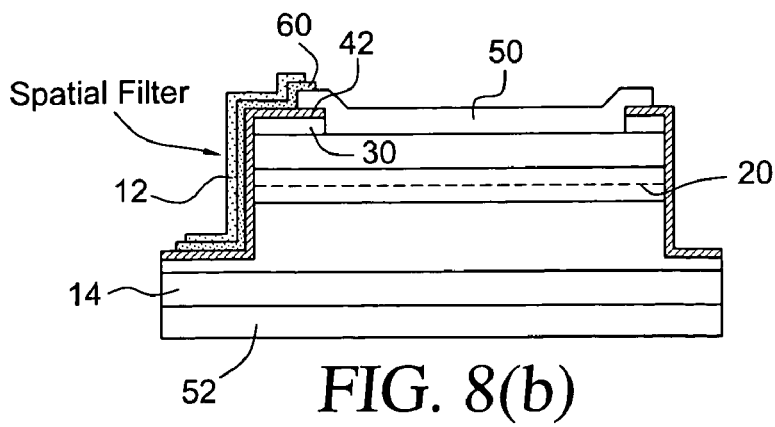

Using lithography for defining a lift-off pattern, evaporation of material, and lift-off, the spatial filter, or reflector 12, is formed as shown in FIGS. 8(a) and 8(b). The filter 12 may incorporate multiple layers, and in on example it included three layers, as follows:

| Layer Number | Material | Index of Refraction at 1310 nm | Thickness |
|---|---|---|---|
| 1 | Si | 3.4 | 96.3 nm |
| 2 | $SiO_2$ | 1.45 | 226.0 nm |
| 3 | Si | 3.4 | 96.3 nm |

The spatial filter 12, as formed for the single laser element illustrated in the figures, has a reflectivity that is higher than that of the surface 60 on which it is deposited so that a larger percentage of light is reflected from the spatial filter than from the remainder of the surface. This allows preferential lasing of the single element laser determined by the two-dimensional (height and width) shape of the spatial filter 12. The use of an AR coating 60 on the surface of the facet 34 allows the facet to have a small reflectivity prior to the deposition of the spatial filter and this creates a large difference between the two dimensional spatial filter 12 reflectivity and the remaining AR coated surface of the facet. The large difference in reflectivity results in large impact of the spatial filter.

Although for a single element laser a high reflectivity spatial filter is desired to enable stable spatial mode behavior, other photonic devices may benefit from low reflectivity spatial filters, a patterned spatial filter in two-dimensions, or a non-contiguous patterned spatial filter in two-dimensions. Although the AR coating and spatial filter was described as being applied to one of the two facets of a laser, it is desirable in some cases to have the AR coating and spatial filter on both facets for even stronger spatial beam shape control. In the case of GaN violet-blue emitting lasers, material suitable at these wavelengths would be used to modify the reflectivity, whether it be AR or a high reflectivity spatial filter.

Although in the process described above the n-contact 52 for the laser was evaporated before the deposition of the AR film and spatial filter, it could also be evaporated after these steps are performed. The reason for evaporating the n-contact before the AR layer and spatial filter in the described example was to allow before and after analysis of a given laser.

Figure 9:
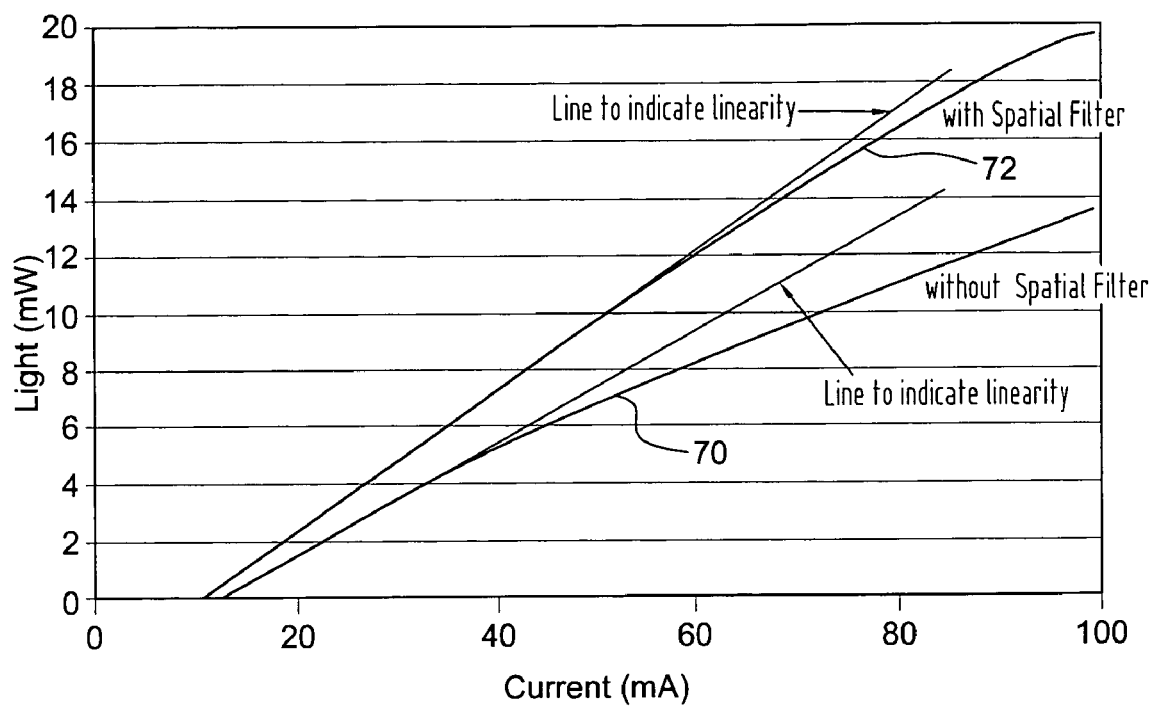
FIG. 9 is a graphical illustration of the light output vs. current characteristics of a laser before and after the application of a spatial filter.

Generally, if a laser operates in single lateral mode, the Light vs. Current (L-I) characteristics show a constant slope without any kinks. However, if a laser allows more than one lateral mode, then the L-I characteristics will kink as shown by the lower curve 70 in the graph of FIG. 9. The width of the spatial filter 12 was 2.2 μm for this laser that has a 3.2 μm ridge width, and its use produced a more linear curve 72. The deviation of the L-I curves from the straight lines in FIG. 9 is representative of the onset of a mode beyond the single lateral mode. As illustrated, introducing spatial filters allows a laser that could only operate in single lateral mode below 6 mW, to operate in single lateral mode up to 12 mW.

Figure 10:
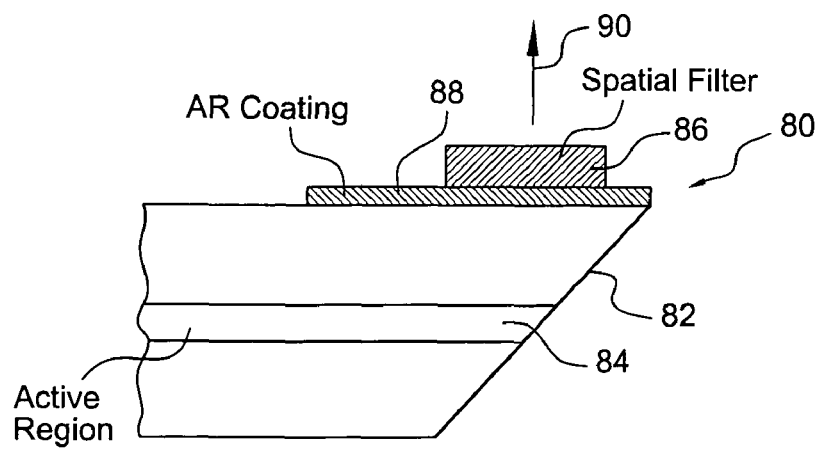
FIGS. 10 and 11 are diagrammatic side and top views of a second embodiment of the invention, illustrating a surface-emitting laser having a spatial filter.
Figure 11:
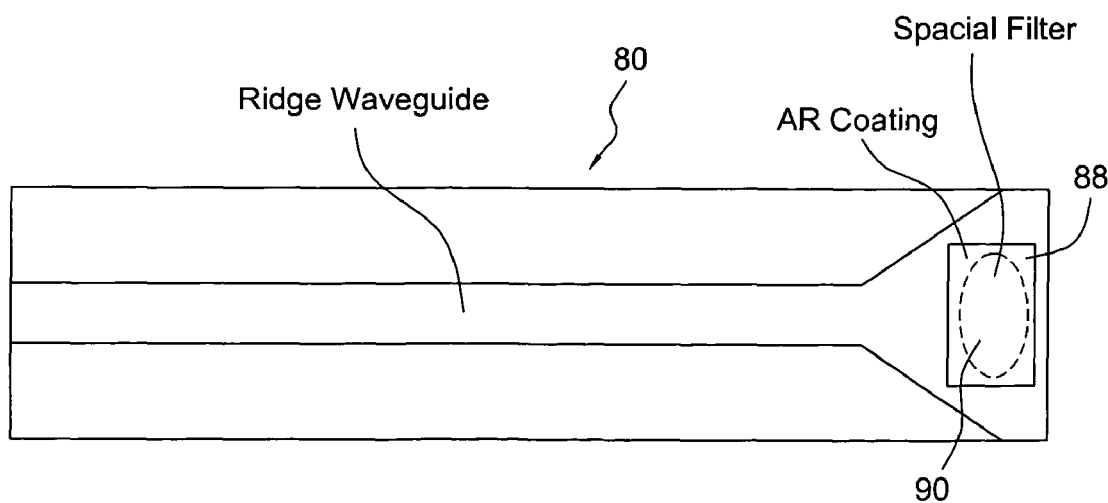

Horizontal Cavity Surface-Emitting Lasers (HCSELs) illustrated at 80 in FIGS. 10 and 11, are described in U.S. patent application Ser. Nos. 10/958,069, filed Oct. 5, 2004 and 10/963,739, file Oct. 14, 2004, the disclosures of which are hereby incorporated herein by reference. HCSELs are formed with an angled etched facet 82, an approximately 45 degrees, that reflects laser light generated in the active region 84 upwardly (or downwardly) in a direction perpendicular to the plane of the substrate on which the laser is fabricated. A lensed surface, instead of a flat surface, can be located above the 45 degree etched facet to compensate for divergence.

A spatial filter 86 is deposited on an AR coating 88 covering the top surface of the HCSEL so that the spatial performance of the output beam 90 is modified and manipulated. FIG. 10 shows a cross-sectional view of the HCSEL 80 with an AR coating 88 followed by a spatial filter 86 having a reflectivity of about 85%. FIG. 11 shows the top view of the same laser, where the AR coating 88 is first applied followed by the spatial filter 90 that affects the beam shape that emerges from the HCSEL.

Although the present invention has been illustrated in terms of preferred embodiments, it will be understood that variations and modifications may be made without departing from the true spirit and scope thereof as set out in the following claims.

What is claimed is:

1. A photonic device comprising:
   a substrate;
   an epitaxial semiconductor structure including an active layer, a lower cladding layer, and an upper cladding layer;
   an etched facet fabricated in said structure;
   a ridge waveguide fabricated in said upper cladding layer; and
   a spatial filter deposited on said etched facet, said spatial filter having a width that is smaller than a width of said ridge waveguide and being selected to increase a range of currents that provide a light output that is linear as a function of current.

2. The photonic device of claim 1, wherein said spatial filter comprises multiple layers of material.

3. The photonic device of claim 1, further including an AR coating on said facet between said facet and said spatial filter.

4. A photonic device comprising:
   a substrate;
   an epitaxial semiconductor structure on said substrate, the structure including an active layer, a lower cladding layer, and an upper cladding layer;
   an etched facet at an end of said structure;
   a ridge waveguide fabricated in said upper cladding layer;
   an anti-reflective coating on said facet; and
   a spatial filter on said coating, said spatial filter having a width that is smaller than a width of said ridge waveguide and being selected to increase a range of currents that provide a light output that is linear as a function of current.

5. The photonic device of claim 4, wherein said AR coating includes dielectric coating on said facet, and where said spatial filter includes multiple layers of deposited material on said AR coating.

6. The photonic device of claim 5, further including an electrical contact for supplying current to said semiconductor structure to cause light to propagate in said structure and to be at least partially emitted from said facet.

7. The photonic device of claim 6, wherein said spatial filter is located on said facet to allow said emitted light to have a single-lateral mode shape.

8. The photonic device of claim 5, wherein said spatial filter is a reflectivity-modifying coating.

9. The photonic device of claim 8, wherein said spatial filter is shaped into a rectangle on said coating to modify light emitted from the photonic device to have a single-lateral mode shape.

10. A method for fabricating a single lateral mode semiconductor photonic device capable of emitting a beam of light, comprising:
    depositing an epitaxial semiconductor structure, including an active layer, a lower cladding layer, and an upper cladding layer on a substrate;
    forming an etched facet in said structure;
    etching said upper cladding layer to form a ridge waveguide therein;
    depositing an antireflective coating on said etched facet of the photonic device; and
    depositing a reflectivity modifying coating on said antireflective coating in a spatially controlled manner to modify the spatial performance of a beam emitted by the photonic device, said spatial filter having a width that is smaller than a width of said ridge waveguide and being selected to increase a range of currents that provide a light output that is linear as a function of current.

11. The method of claim 10, wherein spatially controlling the reflectivity modifying coating includes lithographically controlling deposition of the coating on said antireflective coating.

12. A photonic device comprising:
    a substrate;
    an epitaxial semiconductor structure including an active layer, a lower cladding layer, and an upper cladding layer;
    a ridge waveguide fabricated in said upper cladding layer;
    an etched facet fabricated in said structure at an angle other than perpendicular to said substrate causing total internal reflection at said etched facet of light propagating in said ridge waveguide and impinging on said etched facet; and
    a spatial filter deposited on a surface parallel to said substrate and above said angled etched facet, said spatial filter having a width that is smaller than a width of said ridge waveguide and being selected to increase a range of currents that provide a light output that is linear as a function of current.

13. The photonic device of claim 12, wherein said spatial filter comprises multiple layers of material.

14. The photonic device of claim 12, further including an AR coating on said surface between said surface and said spatial filter.

15. The photonic device of claim 12, wherein said surface is the surface of a lens.

16. The photonic device of claim 1, wherein a second etched facet is formed in said structure and a second spatial filter is deposited on said second etched facet.

17. The photonic device of claim 4, wherein a second etched facet is formed in said structure and a second spatial filter is deposited on said second etched facet.

18. The method of claim 10, wherein a second etched facet is formed in said structure and a second spatial filter is deposited on said second etched facet.

19. The photonic device of claim 12, wherein a second etched facet is formed in said structure and a second spatial filter is deposited on said second etched facet.

* * * * *